(12) United States Patent
Chao et al.

(10) Patent No.: US 6,429,119 B1
(45) Date of Patent: Aug. 6, 2002

(54) DUAL DAMASCENE PROCESS TO REDUCE ETCH BARRIER THICKNESS

(75) Inventors: Li-Chih Chao, Yang-Mei; Chia-Shiung Tsai, Hsin-chu; Ming-Huei Lui, Panchiao; Jen-Cheng Liu, Chia-Yih; Chao-Cheng Chen, Matou, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/405,059

(22) Filed: Sep. 27, 1999

(51) Int. Cl.$^7$ .......................................... H01L 21/4763
(52) U.S. Cl. ...................................... 438/633; 438/634
(58) Field of Search ................................ 438/620, 622, 438/624, 625–638, 666, 672, 675, 687, 634, 633, 737

(56) References Cited

U.S. PATENT DOCUMENTS

| | | | | |
|---|---|---|---|---|
| 5,604,156 A | * | 2/1997 | Chung et al. ................ | 437/195 |
| 5,801,094 A | | 9/1998 | Yew et al. ................... | 438/624 |
| 5,854,140 A | | 12/1998 | Jaso et al. ................... | 438/740 |
| 5,877,075 A | | 3/1999 | Dai et al. .................... | 438/597 |
| 5,882,996 A | | 3/1999 | Dai .............................. | 438/597 |
| 6,040,243 A | * | 3/2000 | Li et al. ....................... | 438/687 |

* cited by examiner

Primary Examiner—Olik Chaudhuri
Assistant Examiner—Ginette Peralta
(74) Attorney, Agent, or Firm—George O. Saile; Stephen B. Ackerman

(57) ABSTRACT

Using this special dual damascene process, interconnect conducting lines and via contacts are formed which have low parasitic capacitance (low RC time constants). The invention incorporates the use of thin etch stop or etch barrier layers. The key process steps of this invention are a special partial via hole etch and a special via hole liner. The Prior Art dual damascene processes are generally composed of a thick via etch stop layer to avoid damaging underlying Cu during via patterning, as well as, a thick trench etch stop layer to avoid via hole facet during trench patterning. Thick etch stop layers are undesirably due to high dielectric constant values compared with silicon oxide, the intermetal dielectric (IMD). Therefore, the thickness of stop-layer should be reduced to minimize the circuit (RC) time constant delay. In general, there are two main approaches for dual damascene etching. One of the main approaches use self-aligned dual damascene (SADD) etching which requires a thick trench etching stop-layer thickness. The other approach use counter-bore method which requires a thick via etching stop-layer thickness. This invention describes a novel dual damascene process which can minimize the thickness of both via and trench etching stop-layer, while avoiding deleterious damage to the underlying to and via facet profile during via and trench etching.

48 Claims, 2 Drawing Sheets

DUAL DAMASCENE PROCESS TO REDUCE ETCH BARRIER THICKNESS

BACKGROUND OF THE INVENTION

(1) Field of the Invention

This invention relates to a method of fabrication used for semiconductor integrated circuit devices, and more specifically to the formation dual damascene structures are described which use thin etch stop-layers or etch barriers, which lowers parasitic capacitance of the interconnect wiring.

As a background to the current invention, the damascene processing is an alternative method for fabricating planar interconnects. Damascene wiring interconnects (and/or studs) are formed by depositing a dielectric layer on a planar surface, patterning it using photolithography and oxide RIE, then filling the recesses with conductive metal. The excess metal is removed by chemical mechanical polishing (CMP), while the troughs or channels remain filled with metal. For example, damascene wiring lines can be used to form bit lines in DRAM devices, with processing similar to the formation of W studs in the logic and DRAM devices. In both examples, sputtered Ti/TiN liners have been coated with chemical vapor deposited (CVD) W metal, then polished back to oxide.

The damascene approach has been adopted in many applications, since it efficiently provides the high yield and large process windows required for volume manufacturing. The use of CMP leads to a decrease in the number of interlevel shorts and lowers defect densities, since unwanted surface material is easily removed. Upon completion of CMP, the wafer surface is returned in a globally planar state, extending process windows for subsequent process steps, i.e., lithographic, etching, and CMP processing steps.

Key to the damascene processing approach is that the deposited conductive metal is deposited into a previously deposited patterned insulator. This is desirable because mask alignment, dimensional control, rework, and the etching process are all easier when applied to a dielectric rather than metal films. Damascene processing achieves these benefits by shifting the enhanced filling and planarization requirements from dielectric to metal films, and by shifting control over interconnect thickness from metal deposition to insulator patterning and metal CMP.

Sputter deposition has some key advantages as a metal deposition technique because it can be used to deposit many conductive materials, at high deposition rates, with good uniformity and low cost of ownership. Conventional sputtering does not fill or coat recessed features well. Sputtered atoms are typically ejected from a target in all directions, though the degree of flux directionality depends on the specific material being deposited, and on deposition conditions. Conventional sputtering fill is poorer for deeper, narrower (high-aspect-ratio) features. In addition, fill is especially bad for corners of recesses, which have relatively small acceptance angles for flux, and for thick depositions, since the upper surface deposition can block incoming flux and produce a void in the recessed feature.

The fill factor by sputter deposition has been significantly improved by collimating the sputtered flux. A collimated flux is produced by removing sputtered flux that approaches the substrate at a large angle from the surface normal. Typically, this is achieved by inserting between the target and substrate a collimator plate having an array of hexagonal cells.

Collimated sputtering is acceptable for thin liner depositions to cover features having moderate aspect ratios, but is not an appropriate technique for the complete filling of such features. Instead, for short-distance wiring such as studs and bit lines for which the high conductivity of Al is not required, chemical-vapor-deposited (CVD) W has proven to be a robust process that integrates easily with liner deposition and CMP to provide a manufacturing interconnect module. In addition, the W is easily patterned using CMP since it is hard and corrosion-resistant. It is also compatible with RIE formation of overlying Al-based wires, since it offers excellent etch selectivity in the preferred Cl-based chemistries.

Chemical vapor deposition (CVD) of W usually requires an underlying conductive barrier and "seed" layers to prevent consumption of substrate Si from reaction with $WF_6$ at the contact level, and to promote distributed nucleation and low contact resistance. A layer of Ti is used since it provides good adhesion and low contact resistance. However, the Ti alone is not sufficient, because the F from the $WF_6$ reacts with the Ti and produces a brittle, high-resistivity compound. However, the use of a TiN film between the Ti and W solves these problems by enhancing W nucleation while preventing the reaction of F with the Ti or any exposed Si. A W seed layer is then formed on the TiN.

Since Ti-based liners are less conductive and less easily polished than W, it is desirable to keep the liners as thin as possible. However, since the sputtered (PVD) liners are not conformal, inadequate coverage of recesses or foreign material defects can allow F to react with the underlying Ti, causing the liners to detach from their substrate. The TiN layer can crack and curl up, since the film is in tension. The CVD W can then deposit on the rolled-up TiN and these formations are termed tungsten "mounds" or "mushrooms". Improvements in commercial process equipment have improved the CVD liners, for example, the CVD TiN and Ti processes. Furthermore, CVD Ti and TiN offer good conformality, but require higher deposition temperatures and contain higher levels of impurities than do the sputtered (PVD) films.

After deposition, CMP is applied to complete the inlaid structure. In the CMP process, material is removed from the wafer through the combined effects of a polish pad and an abrasive slurry. The chemical dissolution of material is aided by a mechanical component which is useful in removing passivating surface layers. Chemical and mechanical selectivity's between materials are desired, since CMP must remove the metal overburden without removing appreciable amounts of inlaid metal or reducing interconnect thickness.

Scratching of the polished surface must also be avoided. Scratches in the inlaid metal can reduce the cross section locally, resulting in an elevated current density and/or elevated stress, thereby accelerating interconnect failures.

In the dual-damascene process, a monolithic stud/wire structure is formed from the repeated patterning of a single thick oxide film followed by metal filling and CMP. First, a relatively thick oxide layer is deposited on a planar surface. The oxide thickness is slightly larger than the desired final thickness of the stud and wire, since a small amount of oxide is removed during CMP. Stud recesses are formed in the oxide using photolithography and RIE that either partially etches through the oxide or traverses the oxide and stops on the underlying metal to be contacted. The wire recesses can then be formed using a separate photolithography step and a timed oxide etching step. If the former stud RIE option is used, the wire etching completes the drilling of the stud holes.

Alternatively, the wire recesses can be formed first, but this approach makes the photolithography for the studs more difficult, since the resulting surface is less planar. Next, the stud/wire metallization is deposited, then planarized using CMP. The resulting interconnects are produced with fewer process steps than with conventional processing and with the dual damascene process, two layer of metal are formed as one, i.e., wiring line and contact stud vias, avoiding an interface between the layers.

The dual-damascene process can be more difficult to fill and planarization than the single-damascene processing. Specifically, the metal films must now fill features having aspect ratios much greater than 1. This can be attained with CVD W, provided the adhesive liner covers the recessed surfaces. To obtain adequate liner coverage using collimated sputtered (PVD) Ti/TiN liners, a larger liner thickness must be applied, which is then difficult to polish away, without dishing (W dishing due to its easy removal by CMP). Furthermore, the conformal filling afforded by CVD W results in local recesses over the high-aspect-ratio dual-damascene features that contribute to dishing during polishing.

It is a general object of the present invention to provide a novel and improved method for using a dual damascene process for fabricating dual damascene structures which have low parasitic capacitance (lowering RC time constant).

(2) Description of Related Art

The present invention is a new and improved method for using dual damascene process which produces structures with thin etch stop layers or barriers, for quarter micron and below semiconductor devices. Related Prior Art background patents will now be described in this section.

U.S. Pat. No. 5,882,996 entitled "Method of Self-Aligned Dual Damascene Patterning Using Developer Soluble ARC Interstitial Layer, granted Mar. 16, 1999 to Dai describes a method for patterning dual damascene interconnections in semiconductor chips through the use of a developer soluble ARC interstitial layer. This is accomplished by providing a silicon substrate having a composite layer of insulation deposited thereon whereby said composite layer comprises a first layer of dielectric separated from a second layer of dielectric by an intervening intermediate layer of silicon nitride. Then, two layers of photoresist are deposited with an intervening interstitial layer of water soluble anti-reflective coating (ARC). The ARC, having a relatively high refractive index, serves as a barrier to light so that the top layer of photoresist is first line patterned without affecting the second layer. The second layer of photoresist is next hole patterned. The hole pattern is transferred into the top dielectric layer and the intervening silicon nitride layer by etching. The line pattern in the first photoresist layer is etched into the top dielectric layer at the same time the hole pattern is transferred from the top dielectric layer into the bottom dielectric layer by the same etching process. The photoresist layers are then removed and the dual damascene structure thusly formed is filled with metal forming the metal line and hole interconnection on the semiconductor substrate.

U.S. Pat. No. 5,877,075 entitled "Dual Damascene Process Using Single Photoresist Process" granted Mar. 2, 1999 to Dai and Huang describes a method for forming dual damascene patterns using a single photoresist process. A substrate is provided with a tri-layer of insulation formed thereon. A layer of photoresist is formed on the substrate and is imaged with a hole pattern by exposure through a dark field mask. Hole is formed in the photoresist by a wet etch. As a key step, the photoresist is next subjected to post-exposure bake such that the sensitivity of the photoresist is still retained. The same photoresist layer is then exposed for the second time for aligned line patterning using a "clear-field" mask. The line patterned region is cross-linked by performing pre-silylation bake, which region in turn is not affected by the subsequent silylation process that forms a silicon rich mask in the field surrounding the hole and line patterns. The vertical hole is transferred into the middle layer of the underlying composite layer by dry etching. Twine pattern which is next formed in the same photoresist layer is transferred into the top layer of the composite layer while at the same time the hole pattern is transferred to the bottom layer. Having thus formed the vertical hole interconnect and line trench into the insulation layer, metal is deposited into the dual damascene pattern. Any excess metal on the surface of the insulating layer is then removed by any number of ways including chemical-mechanical polishing, thereby planarizing the surface and readying it for the next semiconductor process.

U.S. Pat. No. 5,854,140 entitled "Method of Making an Aluminum Contact" granted Dec. 29, 1998 to Jaso et al describes a method of forming aluminum contacts of sub-micron dimensions wherein, after formation of both vias and line openings in a silicon oxide layer, a metal stop layer is deposited, followed by deposition of aluininum. Alternatively, the metal stop layer is deposited prior to forming the vias and line openings. The excess aluminum is removed by chemical-mechanical polishing, the stop layer providing high selectivity to the chemical mechanical polishing. The stop layer is then removed. The resultant silicon oxide-aluminum surface is planar and undamaged by the chemical-mechanical polishing step.

U.S. Pat. No. 5,801,094 entitled "Dual Damascene Process" granted Sep. 1, 1998 to Yew et al. describes a dual damascene method of forming a two level metal interconnect structure by first providing an interlevel oxide over a device structure and covering the interlevel oxide layer with an etch stop layer. The etch stop layer is patterned to form openings corresponding to the pattern of the interconnects that are to be formed in the first level of the two level interconnect structure. After the etch stop layer is patterned, an intermetal oxide layer, interlevel dielectric (ILD), is provided over the etch stop layer. A photoresist mask is then provided over the interlevel dielectric (ILD) with openings in the mask exposing portions of the ILD layer in the pattern of the wiring lines to be provided in the second level of the interconnect structure. The ILD layer is etched and the etching process continues to form openings in the ILD layer where the ILD is exposed by openings in the etch stop layer. Therefore, with a single etch step, the openings for both the second level wiring lines and the first level interconnects are defined. The dual damascene process forms holes (vias and contacts) and wiring lines (interconnect lines) simultaneously. Metal is then deposited over the structures and excess metal is removed by chemical mechanical polishing (CMP) to define the two level wiring and interconnect structure.

The present invention is directed to a novel and improved method of fabrication an integrated circuit, in which a dual damascene process: partial via etch and via hole liner are formed, easing processing and lowering parasitic capacitance. The method of the present invention requires less processing time, has lower cost than conventional dual damascene methods and produces dual damascene interconnect line and vias structures with low parasitic capacitance.

SUMMARY OF THE INVENTION

It is a general object of the present invention to provide an improved method of forming an integrated circuit in which a special dual damascene process is described which uses a thin etch stop-layer or etch barrier, which lowers parasitic capacitance of the interconnect wiring. Several methods have been proposed for forming dual damascene structures. All these processes need a trench etch stop layer that has a etching selectivity to silicon dioxide, $SiO_2$. Increasing the thickness of the stop layer is easier to process. However, a thicker stop layer will increase the parasitic capacitance. In addition, by using a thinner stop layer (decreases parasitic capacitance), the profiles of the trench and via structures are made more difficult to control. However, in this invention an aligned dual damascene process is presented that is easier to process, by using a partial via etch and a thin via hole liner, and has low parasitic capacitance.

Provided by Prior Art methods is a semiconductor silicon substrate with the first level of metal copper wiring being defined, embedded in a first layer of insulator, silicon oxide $SiO_x$. The invention starts with these conventional layers being provided.

Prior Art methods provide the following consisting of: a semiconductor silicon substrate with the first level of metal copper wiring being defined, embedded in the first layer of insulator, silicon oxide $SiO_x$. The invention starts with these conventional layers being provided by Prior Art methods. Also provided by Prior Art methods, can be a metal "seed layer" and metal diffusion barrier layer beneath the metal copper wiring layers. The metal diffusion barrier and metal "seed" layer beneath the metal copper wiring layers act as a metal diffusion barrier and the seed layer can be used to preferentially pattern and initiate metal film growth (e.g., in plating processes). These said thin film layers or layer can also aid in adhesion for the metal wiring above. In addition, the first level metal is placed on an interlevel dielectric (ILD) insulating layer (an interconnect line layer, or device contact region to P-N junctions), provided by Prior Art methods.

The first etch stop layer is deposited over the first level wiring layer and the insulating layer. This first etch stop layer (via stop layer) is a refractory insulating material or materials with selective etch properties. Silicon nitride, $Si_3N_4$ or $Si_xN_y$, and/or silicon oxynitride, $Si_xON_y$, are utilized for the first etch stop layer and are blanket deposited by chemical vapor deposition (CVD).

The first intermetal dielectric layer (IMD) is blanket deposited over the first etch stop layer. This first IMD layer (via IMD) is also a refractory insulating material or materials with selective etch properties compared to the etch stop layer. Silicon oxide, $SiO_x$, is utilized for this first intermetal dielectric layer (IMD) and is blanket deposited by chemical vapor deposition (CVD).

Next in the process is the blanket deposition of the second etch stop layer. The etch stop layer is refractory insulating material with selective etch properties. Silicon nitride, $Si_3N_4$ or $Si_xN_y$, and/or silicon oxynitride, $Si_xON_y$, are utilized for the second etch stop layer and are blanket deposited by chemical vapor deposition (CVD). This layer must have different or selective etch properties from the subsequent second layer of the intermetal dielectric (IMD), which is silicon oxide $SiO_x$.

A second intermetal dielectric layer (IMD) is blanket deposited over the second etch stop layer. This second IMD layer (trench IMD) is also a refractory insulating material or materials with selective etch properties compared to the etch stop layer. Silicon oxide, $SiO_x$, is utilized for this second intermetal dielectric layer (IMD) and is blanket deposited by chemical vapor deposition (CVD). These layers are patterned by a via photoresist pattern.

In the first embodiment of this invention, a key process step of this invention is a partial via etch with etch depth controlled by an endpoint of the trench etch stop layer. The patterning and partial etch of the via etching, etches through the top IMD layer and through the trench etch stop layer into the via IMD layer and with endpoint process control, stops in the first IMD layer, silicon oxide. The photoresist is removed by an ashing step. Note, the via etching stop layer thickness can be minimize (lowering parasitic capacitance) due to the via partial etching which reduces any loss of the via etching stop-layer during trench etching.

In the second embodiment of this invention, a key process step of this invention is the deposition of a thin via hole liner composed of high oxide etch selectivity material, such as, silicon nitride, $Si_3N_4$ or $Si_xN_y$, and/or silicon oxynitride, $Si_xON_y$. Then the trench photo pattern is defined. The thin film trench liner thickness is less than 500 Angstroms. Key to this invention is that the trench etching stop layer thickness can be minimized due to thin via hole liner (lowering parasitic capacitance). This thin via hole liner reduces trench etching-stop layer facets around via hole during trench etching.

The next process step is the etching of the exposed regions or areas by reactive ion etch (RIE). The trench or channel region is etched and stops on the trench etch stop layer and, at the same time, the via region is etched stopping on the via etch stop layer. Some remaining via liner is removed during the final via etch stop layer removal.

Furthermore, with conventional processing the thicker the continuous etch stop layer the higher the parasitic capacitance which increases the RC time constant of the signals. Prior to the deposition of the conductive metal wiring layer, there can be can be a metal "seed layer" and metal diffusion barrier layer beneath the metal copper wiring layers. Copper metal deposition by chemical vapor deposition (CVD) followed by chemical mechanical polish (CMP) of the excess metal without dishing effects.

The dual damascene process is generally composed of a via etching stop layer to avoid damaging underlying Cu during via patterning, as well as, a trench etching stop layer to avoid via hole facet during trench patterning. However, typical etching stop layer like silicon nitride and silicon oxynitride have undesired higher dielectric constant values than the IMD oxide. Therefore, the thickness of stop-layer should be reduced in consideration of minimizing circuit (RC) time constant delay. In general, there are two main approaches for dual damascene etching. One of the main approaches use self-aligned dual damascene (SADD) etching which requires a thick trench etching stop-layer thickness. The other approach use counter-bore method which requires a thick via etching stop-layer thickness. This invention describes a novel dual damascene process which can minimize the thickness of both via and trench etching stop-layer, while avoiding damage to the underlying Cu and via facet profile during via and trench etching.

It is a general object of the present invention to provide an improved method of forming an integrated circuit in which a dual damascene process is described above which lowers parasitic capacitance. Applications of this invention can be extended to low dielectric materials for etch stop layers, trench liner and for intermetal dielectric (IMD) layers.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

It is a general object of the present invention to provide a new and improved method of forming an integrated circuit in which a special dual damascene process is described which uses a thin etch stop-layers or etch barriers, which lower parasitic capacitance of the interconnect wiring.

Figure 1:
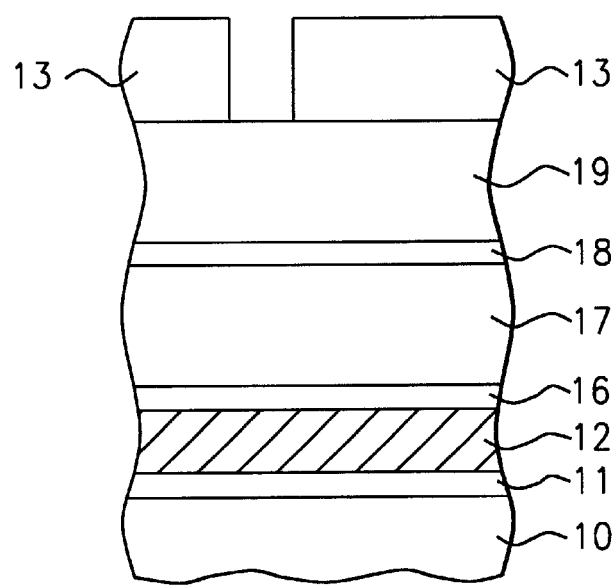
FIG. 1, which in cross-sectional representation illustrates the initial starting point for the dual damascene process, which is depositing an etch stop or etch barrier layer (via etch stop) over the first IMD, intermetal dielectric, trench IMD layer. Via photoresist pattern is sketched.

Referring to FIG. 1, which in cross-sectional representation, shows a semiconductor silicon substrate 10 with the first level of metal copper wiring 12 being defined, embedded in the first layer of insulator 14, silicon oxide $SiO_x$ (not shown in Figs.). The invention starts with these conventional layers being provided by Prior Art methods. Also provided by Prior Art methods, can be a metal "seed layer" and metal diffusion barrier layer beneath the metal copper wiring layers 12. (These seed and barrier layers are thin film adhesion layers or layer, not shown in the Figs.). In addition, the first level metal 12 is placed on an interlevel dielectric (ILD) insulating layer 11 (an interconnect line layer, or device contact region to P-N junctions), provided by Prior Art methods.

Referring to again to FIG. 1, the first etch stop layer 16 is deposited over the first level wiring layer 12 and the insulating layer 14. This first etch stop layer (via stop layer) is a refractory insulating material or materials with selective etch properties. Silicon nitride, $Si_3N_4$ or $Si_xN_y$, and/or silicon oxynitride, $Si_xON_y$, are utilized for the first etch stop layer 16 and are blanket deposited by chemical vapor deposition (CVD), in a thickness range from about 100 to 2,000 Angstroms.

Referring again to FIG. 1, the first intermetal dielectric layer (IMD) 17 is blanket deposited over the first etch stop layer 16. This first IMD layer (via IMD) is also a refractory insulating material or materials with selective etch properties compared to the etch stop layer 16. Silicon oxide, $SiO_x$, is utilized for this first intermetal dielectric layer (IMD) 17 and is blanket deposited by chemical vapor deposition (CVD), in a thickness range from about 1,000 to 20,000 Angstroms.

Referring again to FIG. 1, next in the process is the blanket deposition of the second etch stop layer 18, as depicted in FIG. 1. The etch stop layer 18 is refractory insulating material with selective etch properties. Silicon nitride, $Si_3N_4$ or $Si_xN_y$, and/or silicon oxynitride, $Si_xON_y$, are utilized for the second etch stop layer 18 and are blanket deposited by chemical vapor deposition (CVD), in a thickness range from about 100 to 2,000 Angstroms. This layer must have different or selective etch properties from the subsequent second layer of the intermetal dielectric (IMD) 19, which is silicon oxide $SiO_x$.

Referring again to FIG. 1, the second intermetal dielectric layer (IMD) 19 is blanket deposited over the second etch stop layer 18. This second IMD layer (trench IMD) is also a refractory insulating material or materials with selective etch properties compared to the etch stop layer 18. Silicon oxide, $SiO_x$, is utilized for this second intermetal dielectric layer (IMD) 19 and is blanket deposited by chemical vapor deposition (CVD), in a thickness range from about 1,000 to 20,000 Angstroms. These layers are patterned by a via photoresist pattern 13, as depicted in FIG. 1.

Figure 2:
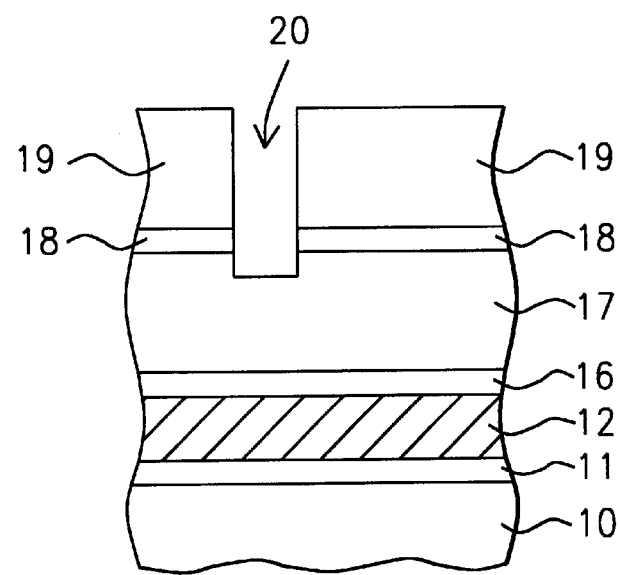
FIG. 2, which in cross-sectional representation illustrates one key process step of this invention: the partial via etching with etching depth controlled by the endpoint of trench etch stop-layer. Photoresist is removed by plasma ashing (not shown in Fig.).

Referring to FIG. 2, this sketches in cross-section, one embodiment of this invention. This shows a partial via etch 20 (arrow) with etch depth controlled by an endpoint trench etch stop layer. The patterning and partial etch of the via etching, etches through the top IMD layer 19 and through the trench etch stop layer 18 into the via IMD layer 17 and with endpoint process control, stops in the first IMD layer 17, silicon oxide. The photoresist is removed by an ashing step. Note, the via etching stop layer thickness 16 can be minimize (lowering parasitic capacitance) due to the via partial etching which reduces any loss of the via etching stop-layer during trench etching.

Figure 3:
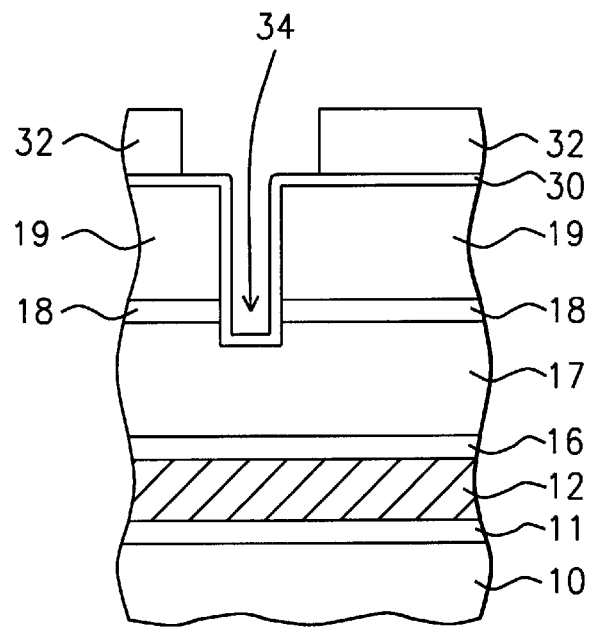
FIG. 3, which in cross-sectional representation illustrates another key process step of this invention: the deposition of a thin via hole liner composed of high oxide etch selectivity materials, e.g., silicon nitride/silicon oxynitride. The trench photo pattern is also sketched.

Referring to FIG. 3, in cross-sectional representation, another embodiment of this invention is shown. This shows the key process step which is the deposition of a thin via hole liner 30 composed of high oxide etch selectivity material, such as, silicon nitride, $Si_3N_4$ or $Si_xN_y$, and/or silicon oxynitride, $Si_xON_y$. The trench photo pattern 32 is defined. The thin film trench liner thickness is less than 500 Angstroms. (2) Trench etching stop layer 18 thickness can be minimized due to thin via hole liner 30 (lowering parasitic capacitance). This thin via hole liner reduces trench etching-stop layer facets 34 (arrow) around via hole during trench etching.

Figure 4:
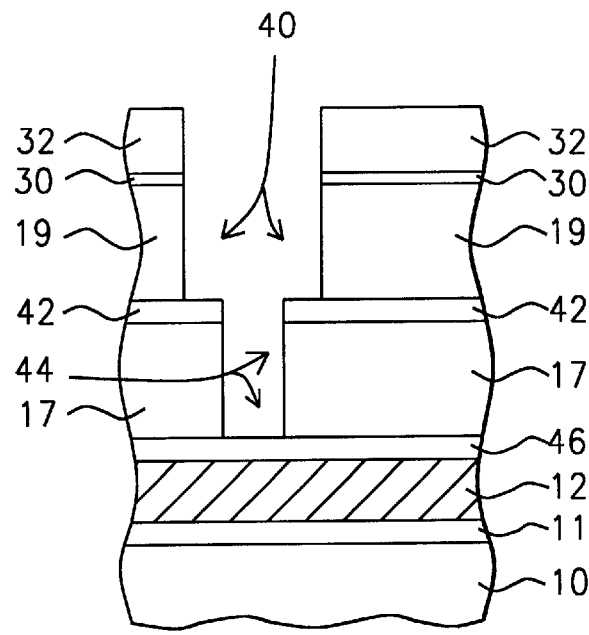
FIG. 4, which in cross-sectional representation illustrates trench etching to stop on trench etching stop-layer and simultaneously the completion of via etching to stop on via etching stop layer.

Referring to FIG. 4, in cross-sectional representation shows the regions or areas exposed to and removed by reactive ion etch (RIE). The trench region 40 (arrows) is etched and stops on the trench etch stop layer 42 and, at the same time, the via region 44 (arrows) is etched stopping on the via etch stop layer 46. Some remaining via liner (not shown in Figs.) is removed during the final via etch stop layer removal.

Furthermore, with conventional processing the thicker the continuous etch stop layer the higher the parasitic capacitance which increases the RC time constant of the signals. Prior to the deposition of the conductive metal wiring layer, there can be can be a metal "seed layer" and metal diffusion barrier layer beneath the metal copper wiring layers. (The seed and barrier layers are thin film layers or layer, which aid adhesion and are not shown in the Figs.). Copper metal deposition, e.g., by chemical vapor deposition (CVD), is then followed by chemical mechanical polish (CMP) of the excess metal without dishing effects.

The dual damascene process is generally composed of a via etching stop layer to avoid damaging underlying Cu during via patterning as well as a trench etching stop layer to avoid via hole facet during trench patterning. However, typical etch stop layers, silicon nitride and silicon oxynitride, have undesired higher dielectric constant values than the IMD oxide. Therefore, the thickness of stop-layer should be reduced in consideration of minimizing circuit (RC) time constant delay. In general, there are two main approaches for dual damascene etching. One of the main approaches use self-aligned dual damascene (SADD) etching which requires a thick trench etching stop-layer thickness. The other approach use counter-bore method which requires a thick via etching stop-layer thickness. This invention describes a novel dual damascene process which can minimize the thickness of both via and trench etching stop-layer, while avoiding damage to the underlying Cu and via facet profile during via and trench etching.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit on a substrate, the method comprising:

providing a substrate or substrate module;

providing a substrate having a layer selected from the group consisting of dielectric, interlevel dielectric (ILD), or an interconnect line layer, or device contact region to P-N junctions;

providing a first level of conducting wiring being defined and embedded in a first layer of insulator;

blanket depositing of a first etch stop barrier;

blanket depositing of the first intermetal dielectric layer (IMD) over first etch stop barrier;

blanket depositing of a second etch stop barrier layer over the first intermetal dielectric layer;

blanket depositing of a second IMD layer;

patterning and etching via partially with partial removal over via and leaving some first IMD material;

plasma ashing to remove organic material;

blanket depositing a thin via hole liner composed of high oxide etch selectivity material;

patterning and etching trench and via together, stopping on the second stop barrier and on first stop barrier, respectively;

depositing channel and via barrier liner material, in addition to conducting material, and polishing back by chemical mechanical polishing (CMP) the excess; repeating the above process steps to construct multilevel conducting layers by this integrated method.

2. The method of claim 1, wherein said substrate is semiconductor single crystal silicon.

3. The method of claim 1, wherein said layers of etch stop barriers are composed of refractory materials, i.e., silicon nitride and silicon oxynitride with very different etch properties than silicon oxide for selective etching and act as etch stop barriers.

4. The method of claim 1, wherein highly selective etch steps are performed using both the large etch differences between silicon oxide and silicon nitride and special partial etch step, utilizing both double levels of said etch barrier stop layers, for via and trench.

5. The method of claim 1, wherein the combination of partial via etch and a via liner are utilized to fabricate the via and trench structures, thus minimizing the thickness of the etch stop layers which reduces parasitic capacitance (lowers RC time constant).

6. The method of claim 1, wherein the combination of partial via etch and a via liner are utilized to fabricate the via and trench structures, thus minimizing the formation of facets around the via hole during trench etching.

7. The method of claim 1, wherein said via hole liner layer is composed of refractory material, i.e., silicon nitride and silicon oxynitride, with very different etch properties than silicon oxide for selective etching.

8. The method of claim 1, wherein the highly selective patterned etches comprise the following etch selectively ratios for the said etch stop barrier layers one and two, etch stop barrier layers:

with thickness from 100 to 2,000 Angstroms for the silicon oxide layer, the first IMD thickness and for the second IMD thickness from 1,000 to 20,000 Angstroms, with said etch steps etch ratios for etch one and two, oxide to nitride of about 5 to 20 (or larger).

9. The method of claim 1, wherein the highly selective patterned etches comprise critical process controls for all etch steps, with the use of fine tuning the etch selectivity, the use of endpoint signal detection methods, and the use of said etch stop barriers for via and trench.

10. The method of claim 1, wherein the trench or channel and said via hole contact comprises a diffusion barrier liner, which also aids adhesion, liner type materials comprised one selected from the group consisting of Ti, Tin, TaN.

11. The method of claim 1, wherein the conducting material layers for conducting interconnect lines and said via contacts comprise one selected from the group consisting of the following conducting type materials: Al, Cu, AlCuSi.

12. The method of claim 1, wherein multilevel conducting structures are fabricating by repeating the integrated process described herein.

13. The method of claim 1, wherein each level of conducting structure is planarized by removing excess conducting material, include planarization by chemical mechanical polish (CMP) or etching.

14. The method of claim 1, wherein the special interconnect conducting lines/via contact structures and interconnect structures with low parasitic capacitance are made by using a dual damascene process with patterning comprising of two etch stop barrier layers, two intermetal dielectric layers, one special via liner, two patterning steps, one partial via etch step and one via and trench selective etch step.

15. The method of claim 1, wherein unique conducting interconnect lines/via and interconnect structures are produced by this process, comprising a product with superior lines without etch facets and via contact structures by special patterning, hence improving reliability.

16. A method of fabricating an integrated circuit on a substrate, using a dual damascene process to form conducting interconnect lines/via and interconnect structures are produced by this process, the method comprising the following steps:

providing a substrate or substrate module with integrated circuits therein;

providing a substrate having a layer selected from the group consisting of dielectric interlevel dielectric (ILD), or an interconnect line layer, or device contact region to P-N junctions;

providing a first level of conducting wiring being defined and embedded in a first layer of insulator;

blanket depositing of a first etch stop barrier over said insulator and conducting wiring;

blanket depositing of the first intermetal dielectric layer (IMD) over first etch stop barrier;

blanket depositing of a second etch stop barrier over said first intermetal dielectric layer (IMD);

blanket depositing of a second intermetal dielectric layer (IMD);

patterning and etching via partially with partial removal over via and leaving some first IMD material;

plasma ashing to remove organic material;

blanket depositing a thin via hole liner composed of high oxide etch selectivity material;

patterning and etching trench and via together, stopping on the second stop barrier and on first stop barrier, respectively;

depositing trench or channel and via barrier liner material, in addition to conducting material, and polishing back by chemical mechanical polishing (CMP) the excess conducting material layer;

repeating all of the above process steps to construct multilevel conducting interconnect and via structures;

thus by a method of a dual damascene process, robust multilevel interconnect/via and interconnect structures are fabricated, with low parasitic capacitance.

17. The method of claim 16, wherein said substrate is semiconductor single crystal silicon.

18. The method of claim 16, wherein said layers of etch stop barriers are refractory materials, i.e., silicon nitride and silicon oxynitride with very different etch properties than silicon oxide for selective etching and act as etch stop barriers.

19. The method of claim 16, wherein highly selective etch steps are performed using both the large etch differences between silicon oxide and silicon nitride and special partial etch step, utilizing both double levels of said etch barrier stop layers, for via and trench.

20. The method of claim 16, wherein the combination of partial via etch and via liner are utilized to fabricate the via and trench structures, thus minimizing the thickness of the etch stop layers which reduces parasitic capacitance and lowers RC time constant.

21. The method of claim 16, wherein the combination of partial via etch and a via liner are utilized to fabricate the via and trench structures, thus minimizing the formation of facets around the trench etch stop layer during trench etching.

22. The method of claim 16, wherein said via hole liner layer is composed of refractory material, i.e., silicon nitride and silicon oxynitride, with very different etch properties than silicon oxide for selective etching.

23. The method of claim 16, wherein the highly selective patterned etches comprise the following etch selectively ratios for the said etch stop barrier layers one and two, etch stop barrier layers:

with thickness from 100 to 2,000 Angstroms for the silicon oxide layer, the first IMD thickness and for the second IMD thickness from 1,000 to 20,000 Angstroms, with said etch steps etch ratios for etch one and two, oxide to nitride of about 5 to 20 (or larger).

24. The method of claim 16, wherein the highly selective patterned etches comprise critical process controls for all etch steps, with the use of fine tuning the etch selectivity, the use of endpoint signal detection methods, and the use of said etch stop barriers for via and trench.

25. The method of claim 16, wherein the trench or channel and said via hole contact comprises a diffusion barrier liner, which also aids adhesion, liner type materials comprised of one selected from the one selected from the group consisting of Ti, TiN, TaN.

26. The method of claim 16, wherein the conducting material layers for conducting interconnect lines and said via contacts comprise one selected from the group consisting the following conducting type of materials: Al, Cu, AlCuSi.

27. The method of claim 16, wherein multilevel conducting structures are fabricating by repeating the integrated process described herein.

28. The method of claim 16, wherein each level of conducting structure is planarized by removing excess conducting material, include planarization by chemical mechanical polish (CMP) or etching.

29. The method of claim 16, wherein the special interconnect conducting lines/via contact structures and interconnect structures with low parasitic capacitance are made by using a dual damascene process with patterning comprising of two etch stop barrier layers, two intermetal dielectric layers, one special via liner, two patterning steps, one partial via etch step and one via and trench selective etch step.

30. The method of claim 16, wherein unique conducting interconnect lines/via and interconnect structures are produced by this process, comprising a product with superior lines without etch facets and via contact structures by special patterning, hence improving reliability.

31. The method of claim 16, wherein said alternating layers are comprised of refractory materials with very different etch properties for selective etch, etch stops, and can be alternating layers of silicon oxide and silicon nitride with varying thickness.

32. A method of fabricating an integrated circuit on a substrate, using a dual damascene process to form robust conducting interconnect lines/via and interconnect structures are produced by this process, the method comprising the following steps:

providing a substrate or substrate module with integrated circuits therein;

providing a substrate having a layer selected from the group consisting of dielectric, interlevel dielectric (ILD), silicon oxide, or an interconnect conducting metal line wiring, or semiconductor device contact region to P-N junctions;

providing a first level of conducting metal wiring being defined and embedded in a first layer of insulator, silicon oxide;

blanket depositing of a thin first etch stop barrier over said insulator, silicon nitride/silicon oxynitride and conducting copper wiring;

blanket depositing of the first intermetal dielectric layer (IMD), silicon oxide, over first etch stop barrier;

blanket depositing of a thin second etch stop barrier, silicon nitride/silicon oxynitride, over said first intermetal dielectric layer (IMD);

blanket depositing of a second intermetal dielectric layer (IMD), silicon oxide;

patterning and etching via partially with partial removal over via and leaving some first IMD material;

plasma ashing to remove organic material;

blanket depositing thin (less than 500 Angstroms) via hole liner composed of high oxide etch selectivity material, silicon nitride/silicon oxynitride;

patterning and reactive ion etching (RIE) trench and via together, stopping on the second stop barrier and on first stop (via) barrier, respectively;

depositing trench or channel and via barrier liner material selected from the group consisting of Ti, TiN, and taN, in addition to conducting copper, and polishing back by chemical mechanical polishing (CMP) the excess conducting copper layer;

repeating all of the above process steps to construct multilevel conducting interconnect and via structures;

thus by a method of a dual damascene process, robust multilevel interconnect/via and interconnect structures are fabricated, with low parasitic capacitance.

33. The method of claim 32, wherein said substrate is semiconductor single crystal silicon or is a ceramic module, with integrated circuits therein.

34. The method of claim 32, wherein said layers of etch stop barriers are composed of refractory materials, i.e., silicon nitride and silicon oxynitride with very different etch properties than silicon oxide for selective etching and act as etch stop barriers.

35. The method of claim 32, wherein highly selective etch steps are performed using both the large etch differences between silicon oxide and silicon nitride and special partial etch step, utilizing both double levels of said etch barrier stop layers, for via and trench.

36. The method of claim 32, wherein the combination of partial via etch and a via liner are utilized to fabricate the via and trench structures, thus minimizing the thickness of the etch stop layers which reduces parasitic capacitance and lowers RC time constant.

37. The method of claim 32, wherein the combination of partial via etch and a via liner are utilized to fabricate the via and trench structures, thus minimizing the formation of facets around the trench etch stop layer during trench etching.

38. The method of claim 32, wherein said via hole liner layer is composed of refractory material, i.e., silicon nitride and silicon oxynitride, with very different etch properties than silicon oxide for selective etching.

39. The method of claim 32, wherein the highly selective patterned etches comprise the following etch selectively ratios for the said etch stop barrier layers one and two, etch stop barrier layers:

with thickness from 100 to 2,000 Angstroms for the silicon oxide layer, the first IMD thickness and for the second IMD thickness from 1,000 to 20,000 Angstroms, with said etch steps etch ratios for etch one and two, oxide to nitride of about 5 to 20 or larger.

40. The method of claim 32, wherein the highly selective patterned etches comprise critical process controls for all etch steps, with the use of fine tuning the etch selectivity, the use of endpoint signal detection methods, and the use of said etch stop barriers for via and trench.

41. The method of claim 32, wherein the trench or channel and said via hole contact comprises a diffusion barrier liner, which also aids adhesion, liner type materials comprised of one selected from the group consisting of Ti, TiN, TaN.

42. The method of claim 32, wherein the conducting material layers for conducting interconnect lines and said via contacts comprise one selected from the group consisting of the following conducting type materials: Al, Cu, AlCuSi.

43. The method of claim 32, wherein multilevel conducting structures are fabricating by repeating the integrated process described herein.

44. The method of claim 32, wherein each level of conducting structure is planarized by removing excess conducting material, include planarization by chemical mechanical polish (CMP) or etching.

45. The method of claim 32, wherein the special interconnect conducting lines/via contact structures and interconnect structures with low parasitic capacitance are made by using a dual damascene process with patterning comprising of two etch stop barrier layers, two intermetal dielectric layers, one special via liner, two patterning steps, one partial via reactive ion etch (RIE) step and one via and trench RIE selective etch step.

46. The method of claim 32, wherein unique conducting interconnect lines/via and interconnect structures are produced by this process, comprising a product with superior lines without etch facets and via contact structures by special patterning, hence improving reliability.

47. The method of claim 32, wherein said alternating layers of refractory materials with very different etch properties for selective etch, etch stops can be alternating layers of silicon oxide and silicon nitride with varying thickness.

48. The method of claim 32, wherein the highly selective patterned etches comprise critical process controls for all etch steps, with the use of fine tuning the etch selectivity and the use of endpoint signal detection methods.

* * * * *